US008759117B2

(12) United States Patent
Yang et al.

(10) Patent No.: US 8,759,117 B2
(45) Date of Patent: Jun. 24, 2014

(54) METHOD OF FABRICATING ARRAY SUBSTRATE FOR ORGANIC ELECTROLUMINESCENT DEVICE AND METHOD OF REPAIRING THE SAME

(75) Inventors: Mi-Youn Yang, Seoul (KR); Jun-Ho Lee, Gyeonggi-do (KR); Seung-Hyun Cho, Ulsan (KR)

(73) Assignee: LG Display Co., Ltd., Seoul (KR)

( * ) Notice: Subject to any disclaimer, the term of this patent is extended or adjusted under 35 U.S.C. 154(b) by 96 days.

(21) Appl. No.: 13/153,789

(22) Filed: Jun. 6, 2011

(65) Prior Publication Data

US 2012/0064641 A1 Mar. 15, 2012

(30) Foreign Application Priority Data

Sep. 15, 2010 (KR) .................. 10-2010-0090750

(51) Int. Cl.
*H01L 21/00* (2006.01)
(52) U.S. Cl.
USPC .............................................. 438/4; 438/795
(58) Field of Classification Search
CPC ................................................ H01L 2251/568
USPC ........... 438/4, 46, 795; 349/50; 257/E21.028, 257/E21.347
See application file for complete search history.

(56) References Cited

U.S. PATENT DOCUMENTS

| 2006/0012728 | A1* | 1/2006 | Watamura ........................ 349/43 |
| 2006/0043886 | A1* | 3/2006 | Lee et al. ........................ 313/506 |
| 2008/0117344 | A1* | 5/2008 | Kim et al. ........................ 349/39 |
| 2009/0290086 | A1* | 11/2009 | Chang et al. .................... 349/55 |
| 2010/0075562 | A1* | 3/2010 | Kim et al. ........................ 445/2 |
| 2011/0032442 | A1* | 2/2011 | van Aerle et al. ............... 349/38 |

FOREIGN PATENT DOCUMENTS

JP 2007-149688 A 6/2007

* cited by examiner

*Primary Examiner* — Caridad Everhart
(74) *Attorney, Agent, or Firm* — Morgan, Lewis & Bockius LLP

(57) ABSTRACT

A method of fabricating an organic electroluminescent device (OELD) according to the present invention has steps of repairing a pixel region by irradiating a laser on a drain contact hole of a passivation layer in a pixel region in need of the repair; and disabling the connection between an organic electroluminescent diode and a drain electrode of a driving thin film transistor (TFT), where the pixel region of the OELD has i) the driving TFT comprising the drain electrode, ii) the passivation layer covering the driving TFT, while comprising the drain contact hole exposing the drain electrode of the driving TFT, and iii) the organic electroluminescent diode connected to the drain electrode of the driving TFT via the drain contact hole.

19 Claims, 7 Drawing Sheets

METHOD OF FABRICATING ARRAY SUBSTRATE FOR ORGANIC ELECTROLUMINESCENT DEVICE AND METHOD OF REPAIRING THE SAME

CROSS REFERENCE TO RELATED APPLICATIONS

The present application claims the benefit of Korean Patent Application No. 10-2010-0090750 filed in Korea on Sep. 15, 2010, which is hereby incorporated by reference.

FIELD OF THE INVENTION

The present invention relates to an organic electroluminescent device (OELD) and more particularly to a method of fabricating an array substrate for OELD and a method of repairing the same.

BACKGROUND OF THE INVENTION

A cathode ray tube (CRT) has been widely used as a display device. Recently, however, a flat panel display device, such as a plasma display panel (PDP) device, a liquid crystal display (LCD) device and an OELD, is used as a display device instead of the CRT.

Among these flat panel display devices, the OELD has an advantage in thickness and weight because the OELD does not require a backlight unit. The OELD device is a self-emission type display device. In addition, with comparison to the LCD device, the OELD has many advantages, such as a wide viewing angle, contrast ratio, low power consumption, and past response time. Moreover, since a fabricating method for the OELD is simple, there is another advantage of reducing production costs.

The OELD is classified into a passive matrix type and an active matrix type. In the active matrix type OELD, a thin film transistor (TFT) as a switching element is disposed at each pixel. Since the active matrix type OELD device has excellent capabilities of high resolution, low power consumption and lifetime with comparison to the passive matrix type OELD, the active matrix type OELD is much widely introduced.

FIG. 1 is a circuit diagram showing a pixel region of an OELD according to a related art. As shown in FIG. 1, a gate line "GL", a data line "DL", a power supply line "PL", a switching thin film transistor (TFT) "STr", a storage capacitor "StgC", a driving TFT "DTr", and an organic electroluminescent diode "E" are formed in one pixel region "P." The gate line "GL" and the data line "DL" cross each other such that the pixel region "P" is defined, and the power supply line "PL" is formed to be parallel to the data line "DL." The switching TFT "STr" is formed at crossing portion of the gate and data line "GL" and "DL." The driving TFT "DTr" is electrically connected to the switching TFT "STr."

The driving TFT "DTr" is electrically connected to the organic electroluminescent diode "E." In more detail, a first electrode of the organic electroluminescent diode "E" is connected to a drain electrode of the driving TFT "DTr," and a second electrode of the organic electroluminescent diode "E" is connected to the power supply line "PL" (not shown in the figure). The power supply line "PL" provides a source voltage to the organic electroluminescent diode "E." The storage capacitor "Cst" is disposed between gate and source electrodes of the driving TFT "DTr" (not shown in the figure).

When a signal is applied to the switching TFT "STr" through the gate line "GL" such that the switching TFT "STr" is turned on, a signal from the data line "DL" is applied to the gate electrode of the driving TFT "DTr," turning on the driving TFT "DTr.". As a result, light is emitted from the organic electroluminescent diode "E." Further, when the driving TFT "DTr" is turned on, a level of an electric current applied from the power supply line "PL" to the organic electroluminescent diode "E" is determined such that the organic electroluminescent diode "E" can produce a gray scale. The storage capacitor "StgC" serves as maintaining the voltage of the gate electrode of the driving TFT "DTr" when the switching TFT "STr" is turned off. Accordingly, even if the switching TFT "STr" is turned off, a level of an electric current applied from the power supply line "PL" to the organic electroluminescent diode "E" is maintained to next frame.

FIG. 2 is a schematic cross-sectional view of an OELD according to a related art. As shown in FIG. 2, the OELD 10 includes a first substrate 1 and a second substrate 2. The first and second substrates 1 and 2 are spaced apart from each other and attached by a seal pattern 20.

On the first substrate 1, a switching thin film transistor (not shown in the figure), a driving TFT "DTr," a first electrode 3, an organic luminescent layer 5 and a second electrode 7 are formed. An absorbing element 13 for absorbing moisture is formed above the second electrode.

The driving TFT "DTr" is connected to the switching TFT (not shown in the figure), and the first electrode 3 is connected to the driving TFT "DTr." The organic luminescent layer 5 is disposed on the first electrode 3, and the second electrode 7 is disposed on the organic luminescent layer 5. The first and second electrodes 3 and 7, and the organic luminescent layer 5 interposed between the electrodes constitute an organic electroluminescent diode.

The organic luminescent layer 5 provides red, green and blue colors. Specifically, first to third organic luminescent patterns 5a, 5b and 5c, which respectively emit red, green and blue color lights, are formed in each pixel region.

When the first electrode 3 is transparent and the second electrode 7 is opaque, light from the organic luminescent layer 5 passes through the first electrode 3 and the first substrate 1, but not much through the second electrode 7. This is referred to as a bottom emission type OELD. On the other hand, when the first electrode 3 is opaque and the second electrode 7 is transparent, light from the organic luminescent layer 5 passes through the second electrode 7 and the second substrate 2, but not much through the first electrode 3. This is referred to as a top emission type OELD.

Unfortunately, however, defects are generated in parts of a plurality of pixel regions. For example, some pixels constantly emit light because of an electrical shortage problem in electrical lines resulting from a static electricity or particles. This is referred to as a brightening point defect.

SUMMARY OF THE INVENTION

Accordingly, the present invention is directed to a method of fabricating an array substrate for an OELD and a method of repairing an array substrate for the OELD that substantially obviates one or more of the problems due to limitations and disadvantages of the related art.

One object of the present invention is to fabricate or repair an array substrate for an OELD so that a brightening point defect in the OELD is eliminated and the lightening of a pixel is well controlled.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method according to one aspect of the present invention comprises steps of repairing a pixel region by irradiating a laser on a drain contact hole of a passivation layer in a pixel region in need of the repair; and disabling the connection between an organic electroluminescent diode and a drain electrode of a driving thin film transistor (TFT), where the pixel region of the OELD has i) the driving TFT comprising the drain electrode, ii) the passivation layer covering the driving TFT, while comprising the drain contact hole exposing the drain electrode of the driving TFT, and iii) the organic electroluminescent diode connected to the drain electrode of the driving TFT via the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate some embodiments of the invention and together with the description serve to explain the principles of the invention.

DETAILED DESCRIPTION OF THE INVENTION

Reference will now be made in detail to some embodiments of the present invention, examples of which are illustrated in the accompanying drawings.

The following embodiments and Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and/or alterations can be employed without departing from the scope of the presently disclosed subject matter.

Figure 1:
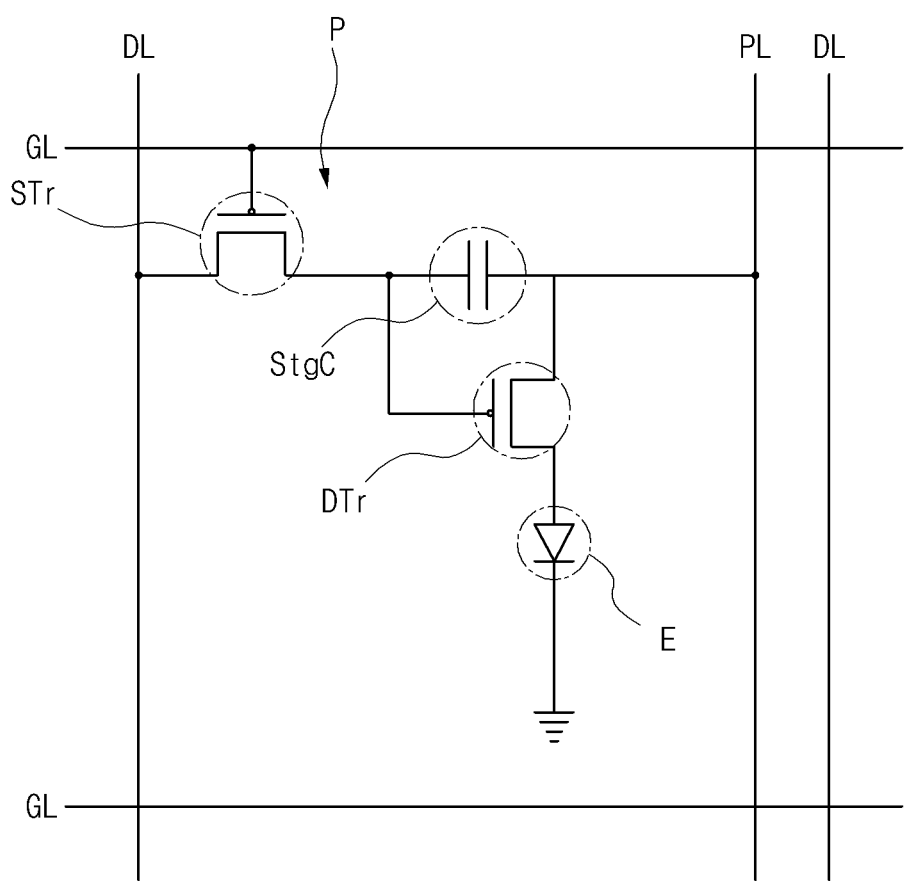
FIG. 1 is a circuit diagram showing a pixel region of an OELD according to the related art.
Figure 2:
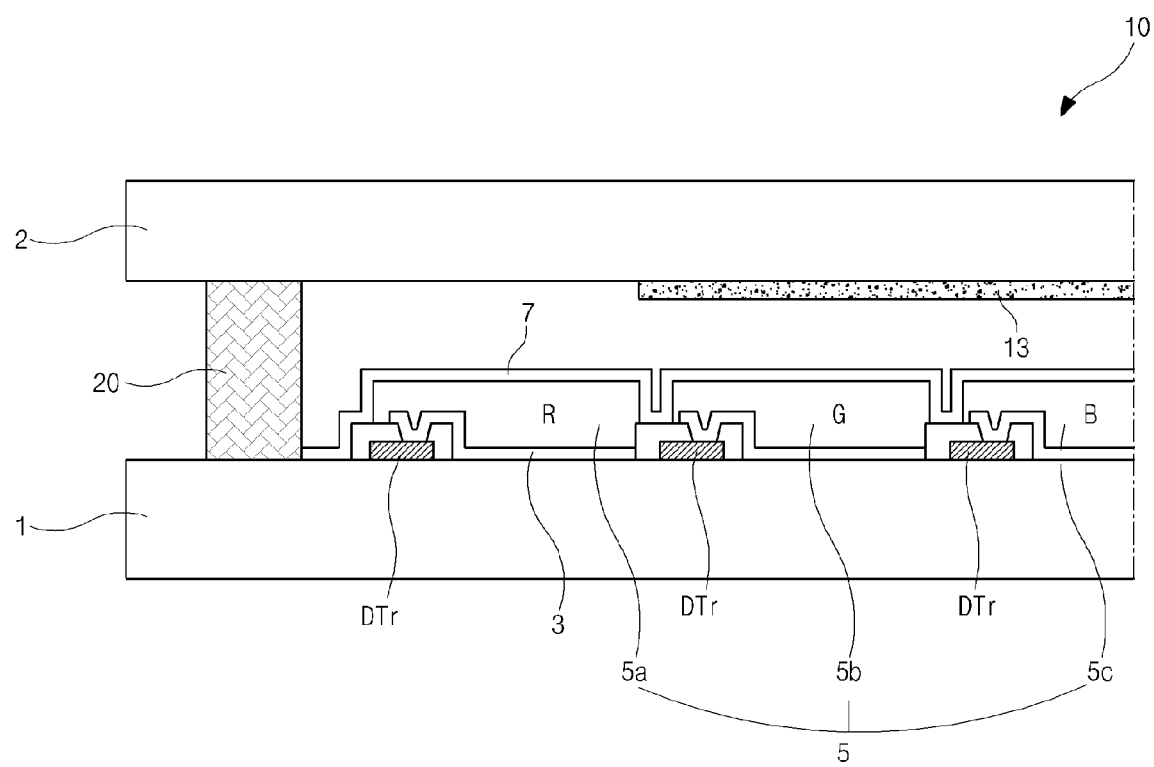
FIG. 2 is a schematic cross-sectional view of an OELD according to the related art.
Figure 3:
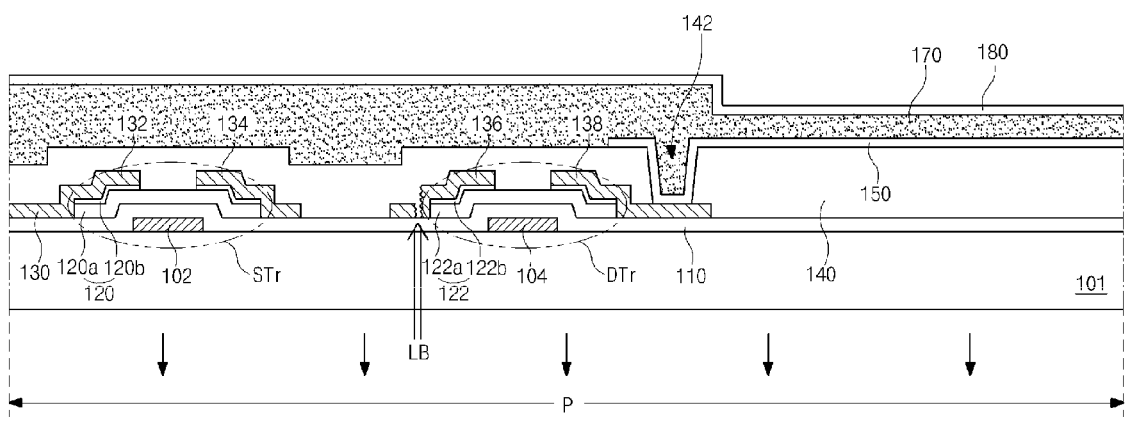
FIG. 3 is a schematic cross-sectional view showing one pixel region of an OELD device according to one exemplary embodiment of the present invention.

FIG. 3 is a schematic cross-sectional view showing one pixel region of an OELD device according to one exemplary embodiment of the present invention.

As shown in FIG. 3, an OELD comprises a driving TFT "DTr," a first electrode 150, an organic luminescent layer 170 and a second electrode 180 on a substrate 101. The driving TFT "DTr," the first electrode 150 and the organic luminescent layer 170 are formed in each pixel region "P," and the second electrode 180 is formed on a substantially entire of the substrate 101. The first electrode 150 is connected to the driving TFT "DTr," and the organic luminescent layer 170 is positioned between the first and second electrodes 150 and 180. The first electrode 150, the organic luminescent layer 170 and the second electrode 180 constitute an organic electroluminescent diode. The organic electroluminescent diode is driven by the driving TFT "DTr" to emit light. Although not shown in the figure, a counter substrate can be added above the first substrate 101.

In some exemplary embodiments, a switching TFT "STr" is formed on the substrate 101 and in each pixel region "P." This switching TFT "STr" may control the driving TFT "DTr." For example, as shown in FIG. 3 according to one exemplary embodiment of the present invention, the switching TFT "STr" comprises a first gate electrode 102, a gate insulating layer 110, a first semiconductor layer 120, a first source electrode 132 and a first drain electrode 134. The gate insulating layer 110 is formed on the first gate electrode 102. The first semiconductor layer 120 is formed on the gate insulating layer 110 and overlaps the first gate electrode 102. The first semiconductor layer 120 comprises a first active layer 120a, comprising intrinsic amorphous silicon, and a first ohmic contact layer 120b, comprising impurity-doped amorphous silicon. In further exemplary embodiments, the first active layer 120a may comprise silicon oxide (SiOx) and/or silicon nitride (SiNx). The first source and drain electrodes 132 and 134 are disposed on the first semiconductor layer 120, and the first drain electrode 134 is spaced apart from the first source electrode 132.

In additional exemplary embodiments, the driving TFT "DTr" is connected to and switched by the switching TFT "STr." As shown in FIG. 3 according to one exemplary embodiment of the present invention, the driving TFT "DTr" comprises a second gate electrode 104, a gate insulating layer 110, a second semiconductor layer 122, a second source electrode 136 and a second drain electrode 138. The gate insulating layer 110 is formed on the second gate electrode 104. The second semiconductor layer 122 is formed on the gate insulating layer 110 and overlaps the second gate electrode 104. The second semiconductor layer 122 comprises a second active 122a, comprising intrinsic amorphous silicon, and a second ohmic contact layer 122b, comprising impurity-doped amorphous silicon. The second source and drain electrodes 136 and 138 are disposed on the second semiconductor layer 122, and the second drain electrode 138 is spaced apart from the second source electrode 136. The second gate electrode 104 of the driving TFT "DTr" is connected to the first drain electrode 134 of the switching TFT "STr."

Alternately, each of the switching TFT "STr" and the driving TFT "DTr" may be a top gate type TFT where each of the first and second semiconductor layers 120 and 122 comprises poly-crystalline silicon.

In accordance with one aspect of the present invention, a gate line, a data line, and a power line are formed as follows. Specifically, a gate line (not shown in the figure) is formed on the substrate 101 along a first direction, and a data line 130 is formed on the substrate 101 along a second direction. The gate line and the data line 130 cross each other to define the pixel region "P." In addition, a power line (not shown in the figure) is formed on the substrate 101 in parallel with one of the gate line and the data line 130 to provide a voltage to the organic electroluminescent diode.

In accordance with another aspect of the present invention, the gate line is connected to the first gate electrode 102 of the switching TFT "STr," and the data line 130 is connected to the first source electrode 132 of the switching TFT "STr." The power line is connected to the second source electrode 136 of the driving TFT "DTr."

In accordance with yet another aspect of the present invention, the first electrode 150 of the organic electroluminescent diode is connected to the second drain electrode 138 of the driving TFT "DTr." Namely, a passivation layer 140, which covers the driving TFT "DTr" and includes a drain contact hole 142 exposing the second drain electrode 138 of the driving TFT "DTr," is formed on the driving TFT "DTr", and the first electrode 150, which is formed on the passivation layer 140, contacts the second drain electrode 138 through the drain contact hole 142.

In accordance with further aspect of the present invention, the first electrode 150 is formed of a relative high work-function material, and the second electrode 180 is formed of a material having a work-function smaller than the first electrode 150. For example, the first electrode 150 may be formed of indium-tin-oxide (ITO), and the second electrode 180 may be formed of Ag/Mg or Cu.

The organic luminescent layer 170 can emit various color lights, such as red, green and blue color lights. For example, first to third organic luminescent patterns, which respective emit red, green and blue color lights, are formed at in each pixel region "P." The organic luminescent layer 170 emits light by providing voltages to the first and second electrodes 150 and 180.

Although not shown in the figure, a bank, which has a lattice shape to surround each pixel region "P," may be optionally formed on the first electrode 150. In this case, the organic luminescent layer 170 in each pixel region "P" may be separated by the bank.

In some exemplary embodiments, the first electrode 150 is transparent and the second electrode 180 is opaque such that light from the organic luminescent layer 170 passes through the first electrode 150 and the substrate 101, but not much through the second electrode 180. Thus, this may be referred to as a bottom emission type OELD.

In the bottom emission type OELD, a brightening point defect may be generated when an electrical shortage is generated in the switching TFT "STr" or the driving TFT "DTr." For example, the second source electrode 136 and the second drain electrode 138 of the driving TFT "DTR" is electrically shorted by particles or an static electricity, the organic luminescent layer 170 has an on state regardless of a voltage to the second gate electrode 104.

Namely, when the switching TFT "STr" is turned on by a voltage to its first gate electrode 102 a voltage of the data line 130 is applied to the second gate electrode 104 of the driving TFT "DTr" through the first source and drain electrodes 132 and 134 of the switching TFT "STr," turning on the driving TFT "DTr.". When the driving TFT "DTr" is on, a voltage of the power line (not shown in the figure) is applied to the first electrode 150 of the organic electroluminescent layer through the second source and drain electrodes 136 and 138 of the driving TFT "DTr." As a result, the organic luminescent layer 170 is turned on and emits light.

As discussed previously, however, with an electrical shortage between the second source and drain electrodes 136 and 138 of the driving TFT "DTr," the voltage of the power line (not shown in the figure) is applied to the first electrode 150 of the organic electroluminescent layer through the second source and drain electrodes 136 and 138 of the driving TFT "DTr" even when the driving TFT "DTr" is off. As a result, there is a brightening point defect in the pixel region "P" where the electrical shortage is generated.

According to some exemplary embodiments of the present invention, the second source electrode 136 may be cut by irradiating a laser beam "LB" to the second source electrode 136 of the driving TFT "DTr" in the pixel region "P," where the electrical shortage can be generated. As a result, the voltage of the power line can not be applied to the first electrode 150.

In further exemplary embodiments, the second source electrode 136 can be cut by irradiating the laser beam "LB" onto the first substrate 101, which is an image display surface. As a result, the organic luminescent layer 170 does not emit light regardless of a state of the switching TFT "STr" and the driving TFT "DTr." In other word, there is a darkening point defect in the pixel region "P." Nonetheless, since the darkening point defect is less sensible than the brightening point defect, production yield of the OELD is increased.

As described herein, in a bottom emission type OELD, the brightening point defect is overcome by irradiating a laser beam onto an image display surface to cut the second surface electrode of the driving TFT. On the other hand, in a top emission type OELD, it is difficult to irradiate to the second source electrode of the driving TFT because the driving TFT is invisible from the image display surface. Accordingly, after marking a position in the pixel region, where the brightening point defect is generated, the OELD panel can be reversed and a laser beam is irradiated onto a surface opposite to the image display surface to cut the second source electrode of the driving TFT. Unfortunately, however, accuracy may be decreased, and other pixel regions may be irradiated unintentionally. In addition, when the laser beam is irradiated to another unintended line, such as a data line and a gate line, there are problems in all pixel regions connected to the unintentionally irradiated line.

In some exemplary embodiments, by irradiating a laser beam at a contact portion between the driving TFT and a first electrode, a voltage to the first electrode is prevented such that the brightening point defect is changed into a darkening point defect.

Figure 4A:
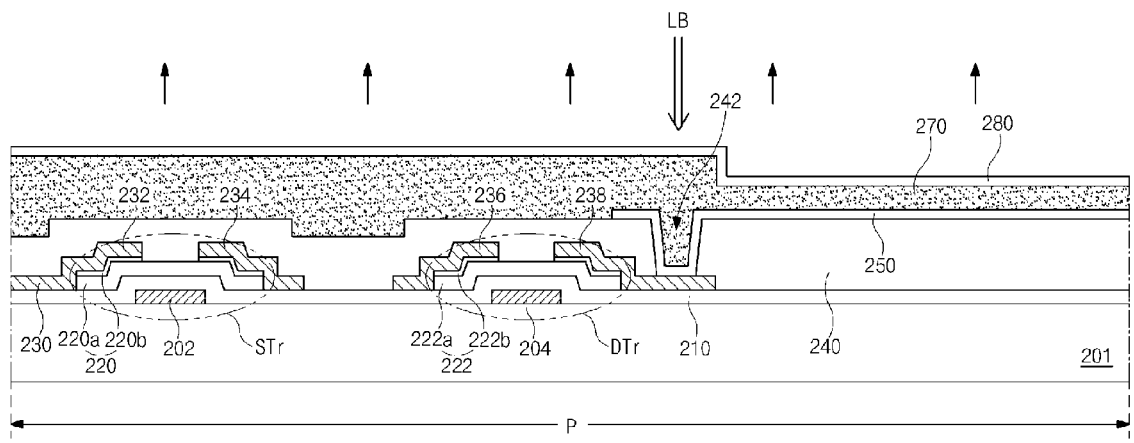
FIGS. 4A and 4B are schematic cross-sectional views showing a repairing process of an OELD according to another exemplary embodiment of the present invention.
Figure 4B:
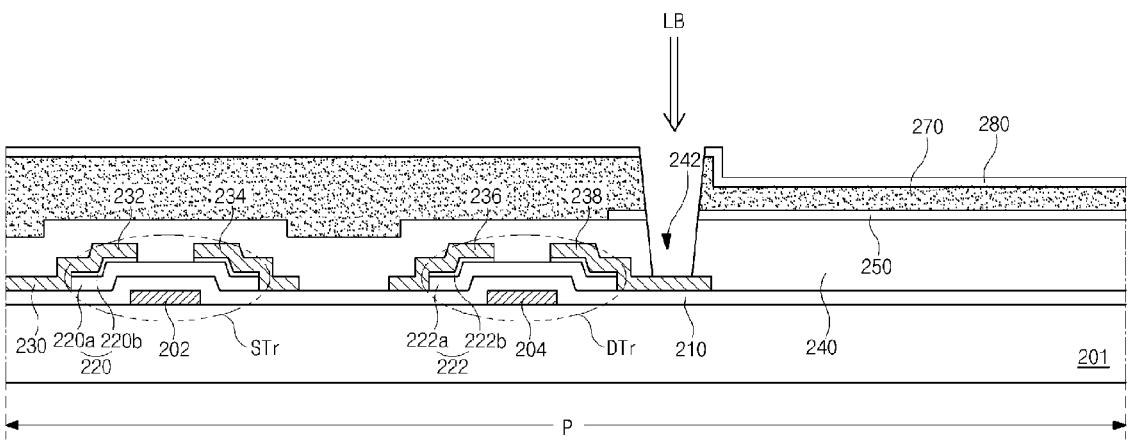

FIGS. 4A and 4B are schematic cross-sectional views showing a repairing process of an OELD according to another exemplary embodiment of the present invention.

As shown in FIG. 4A, an OELD comprises a driving TFT "DTr," a first electrode 250, an organic luminescent layer 270 and a second electrode 280 on a substrate 201. The driving TFT "DTr," the first electrode 250 and the organic luminescent layer 270 are formed in each pixel region "P," and the second electrode 280 is formed on a substantially entire of the substrate 201. The first electrode 250 is connected to the driving TFT "DTr," and the organic luminescent layer 270 is positioned between the first and second electrodes 250 and 280. The first electrode 250, the organic luminescent layer 270 and the second electrode 280 constitute an organic electroluminescent diode. The organic electroluminescent diode is driven by the driving TFT "DTr" to emit light. Although not shown in the figure, a counter substrate can be added above the first substrate 201.

In some exemplary embodiments, a switching TFT "STr" is formed on the substrate 201 and in each pixel region "P." This switching TFT "STr" may control the driving TFT "DTr." For example, as shown in FIG. 4a according to one exemplary embodiment of the present invention, the switching TFT "STr" comprises a first gate electrode 202, a gate insulating layer 210, a first semiconductor layer 220, a first source electrode 232 and a first drain electrode 234. The gate insulating layer 210 is formed on the first gate electrode 202. The first semiconductor layer 220 is formed on the gate insulating layer 210 and overlaps the first gate electrode 202. The first semiconductor layer 220 comprises a first active layer 220a, comprising intrinsic amorphous silicon, and a first ohmic contact layer 220b, comprising impurity-doped amorphous silicon. In further exemplary embodiments, the first active layer 220a may be made of silicon oxide (SiOx) and/or silicon nitride (SiNx). The first source and drain electrodes 232 and 234 are disposed on the first semiconductor layer 220, and the first drain electrode 234 is spaced apart from the first source electrode 232.

In additional exemplary embodiments, the driving TFT "DTr" is connected to and switched by the switching TFT "STr." As shown in FIG. 4a according to one exemplary embodiment of the present invention, the driving TFT "DTr" comprises a second gate electrode 204, a gate insulating layer 210, a second semiconductor layer 222, a second source electrode 136 and a second drain electrode 138. The gate insulating layer 210 is formed on the second gate electrode 204. The second semiconductor layer 222 is formed on the gate insulating layer 210 and overlaps the second gate electrode 204. The second semiconductor layer 222 comprises a second active 222a, comprising intrinsic amorphous silicon, and a second ohmic contact layer 222b, comprising impurity-doped amorphous silicon. The second source and drain electrodes 236 and 238 are disposed on the second semiconductor layer 222, and the second drain electrode 238 is spaced apart from the second source electrode 236. The second gate electrode 204 of the driving TFT "DTr" is connected to the first drain electrode 234 of the switching TFT "STr."

Alternately, each of the switching TFT "STr" and the driving TFT "DTr" may be a top gate type TFT where each of the first and second semiconductor layers 220 and 222 comprises poly-crystalline silicon.

In accordance with one exemplary embodiment of the present invention, a gate line, a data line, and a power line are formed as follows. Specifically, a gate line (not shown in the figure) is formed on the substrate 201 along a first direction, and a data line 230 is formed on the substrate 201 along a second direction. The gate line and the data line 230 cross each other to define the pixel region "P." In addition, a power line (not shown in the figure) is formed on the substrate 201 in parallel with one of the gate line and the data line 230 to provide a voltage to the organic electroluminescent diode.

In accordance with another aspect of the present invention, the gate line is connected to the first gate electrode 202 of the switching TFT "STr", and the data line 230 is connected to the first source electrode 232 of the switching TFT "STr." The power line is connected to the second source electrode 236 of the driving TFT "DTr."

In accordance with yet another aspect of the present invention, the first electrode 250 of the organic electroluminescent diode is connected to the second drain electrode 238 of the driving TFT "DTr." Namely, a passivation layer 240, which covers the driving TFT "DTr" and includes a drain contact hole 242 exposing the second drain electrode 238 of the driving TFT "DTr," is formed on the driving TFT "DTr," and the first electrode 250, which is formed on the passivation layer 240, contacts the second drain electrode 238 through the drain contact hole 242.

In accordance with further aspect of the present invention, the first electrode 250 is formed of a relative high work-function material, and the second electrode 280 is formed of a material having a work-function smaller than the first electrode 250. For example, the first electrode 250 may be formed of indium-tin-oxide (ITO), and the second electrode 280 may be formed of Ag/Mg or Cu.

A passivation layer 240 is disposed on the driving TFT "DTr" and includes a drain contact hole 242 exposing a portion of the second drain electrode 238 of the driving TFT "DTr." The first electrode 250 is formed on the passivation layer 240 and contacts the portion of the second drain electrode 238 through the drain contact hole 242.

The organic luminescent layer 270 can emit various color lights, such as red, green and blue color lights. For example, first to third organic luminescent patterns, which respectively emit red, green and blue color lights, are formed at in each pixel region "P." The organic luminescent layer 270 emits light by providing voltages to the first and second electrodes 250 and 280.

The second electrode 280 may be made thin to be transparent. As a result, light emitted from the organic luminescent layer 270 can pass through the second electrode 280 to display images. This may be referred to as a top emission type OELD. Although not shown in the figure, to increase optical efficiency, a reflective plate may be formed under the first electrode 250.

In addition, although not shown in the figure, a bank, which has a lattice shape to surround each pixel region "P," may be optionally formed on the first electrode 250. In this case, the organic luminescent layer 270 in each pixel region "P" may be separated by the bank.

In the top emission type OELD, a brightening point defect may be generated. For example, the second source electrode 236 and the second drain electrode 238 of the driving TFT "DTR" is electrically shorted by particles or an static electricity, the organic luminescent layer 270 is constantly on regardless of a voltage to the second gate electrode 204.

Namely, when the switching TFT "STr" is turned on by a voltage to its first gate electrode 202, a voltage of the data line 230 is applied to the second gate electrode 204 of the driving TFT "DTr" through the first source and drain electrodes 232 and 234 of the switching TFT "STr," turning on the driving TFT "DTr." When the driving TFT "DTr" is on, a voltage of the power line (not shown in the figure) is applied to the first electrode 250 of the organic electroluminescent layer through the second source and drain electrodes 236 and 238 of the driving TFT "DTr". As a result, the organic luminescent layer 270 is turned on and emits light.

As discussed previously, however, with an electrical shortage between the second source and drain electrodes 236 and 238 of the driving TFT "DTr," the voltage of the power line (not shown in the figure) is applied to the first electrode 250 of the organic electroluminescent layer through the second source and drain electrodes 236 and 238 of the driving TFT "DTr" even when the driving TFT "DTr" is off. As a result, there is a brightening point defect in the pixel region "P" where the electrical shortage is generated.

As mentioned above, since the driving TFT "DTr" in the top emission type OELD is invisible from the image display surface, it is difficult to irradiate a laser beam on an image display surface. Accordingly, after marking a pixel region in need of repair, where the brightening point defect is generated, the OELD panel is reversed and a laser beam is irradiated onto a surface opposite to the image display surface to cut the second source electrode of the driving TFT. Unfortunately, however, when a mis-alignment is generated, other pixel regions may be irradiated unintentionally. In this case, a darkening point defect is generated in the other pixel regions. In addition, when the laser beam is irradiated to another unintended line, such as a data line and a gate line, there are problems in all pixel regions connected to the unintentionally irradiated line.

To prevent these problems, as shown in FIG. 4B, the brightening point defect is avoided by irradiating a laser beam "LB" to the drain contact hole 242 through the image display surface. The inventors surprisingly found that it is possible to irradiate the laser beam to the drain contact hole on the image display surface because the drain contact hole is visible from the image display surface. Namely, the laser beam "LB" is irradiated onto the second electrode 280 to disable or destroy a connection between the first electrode 250 and the second drain electrode 238. After the laser beam "LB" is irradiated, the second electrode 280, the organic luminescent layer 270 and the first electrode 250 are removed such that the second drain electrode 238 is exposed through the drain contact hole 242. The first electrode is electrically disconnected from the driving TFT "DTr." As a result, a voltage of the power line (not shown in the figure) is not applied to the first electrode 250 even when the switching TFT "STr" and the driving TFT "DTr" are turned on such that the brightening point defect is changed into a darkening point defect.

In some exemplary embodiments, the laser beam "LB" is a pulse type and has a wavelength of about 532 nm and energy of about 0.5 to 0.8 mJ. As used herein, the term "about" refers to a range of values ±10% of a specified value. For example, the phrase "about 100 nm" includes ±10% of 100 nm, or from 90 nm to 110 nm.

The laser beam "LB" according to additional embodiments of the present invention includes, but is not limited to, a laser having a wavelength between about 300 nm and about 700 nm, about 400 nm and about 600 nm, about 500 nm and about 550 nm, and about 520 nm and about 540 nm. By this laser beam "LB," a connection between the second drain electrode 238 of the driving TFT "DTr" and the first electrode 250 through the drain contact hole 242 is destroyed, and damage to another element is prevented. If the laser beam "LB" is too weak, the connection is incompletely destroyed such that the brightening point defect can not be resolved. On the other hand, if the laser beam is too strong, other elements, for example, the gate line or the data line, is cut such that a darkening point defect is also generated in other pixel regions.

FIGS. 5A to 5H are schematic cross-sectional views illustrating a fabricating process of an array substrate for an OELD according to yet another exemplary embodiment of the present invention.

Figure 5A:
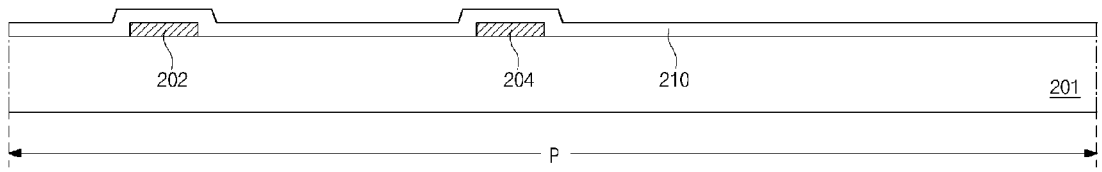
FIGS. 5A to 5H are schematic cross-sectional views illustrating a fabricating process of an array substrate for an OELD according to yet another exemplary embodiment of the present invention.

As shown in FIG. 5A according to some embodiments of the present invention, a first metallic material layer (not shown in the figure) is formed on the substrate 201 by depositing a first metallic material and is patterned using various process, including, but not limited to, a mask process to form the first and second gate electrodes 202 and 204. At the same time, the gate line (not shown in the figure), which is connected to the first gate line 202, is formed. The first metallic material layer is formed of a relatively low resistance metallic material, including, but not limited to, copper (Cu), Cu alloy, aluminum (Al), Al alloy, and molybdenum (Mo). Next, the gate insulating layer 210 is formed on the first and second gate electrodes 202 and 204, and the gate line.

Figure 5B:
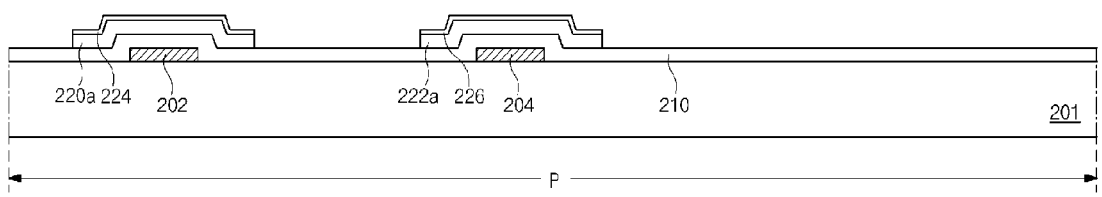

Next, as shown in FIG. 5B according to additional embodiments of the present invention, an intrinsic amorphous silicon layer (not shown in the figure) and an impurity-doped amorphous silicon layer (not shown in the figure) are formed on the gate insulating layer 210 by sequentially depositing intrinsic amorphous silicon and impurity-doped amorphous silicon. The intrinsic amorphous silicon and the impurity-doped amorphous silicon layer may be patterned using various methods, including, but not limited to, a mask process to form the first and second active layers 120a and 122a, a first impurity-doped amorphous silicon pattern 224, and a second impurity-doped amorphous silicon pattern 226. The first and second active layers 120a and 122a respectively overlap the first and second gate electrodes 202 and 204, and the first and second impurity-doped amorphous silicon patterns 224 and 226 are respectively disposed on the first and second active layers 120a and 122a.

Figure 5C:
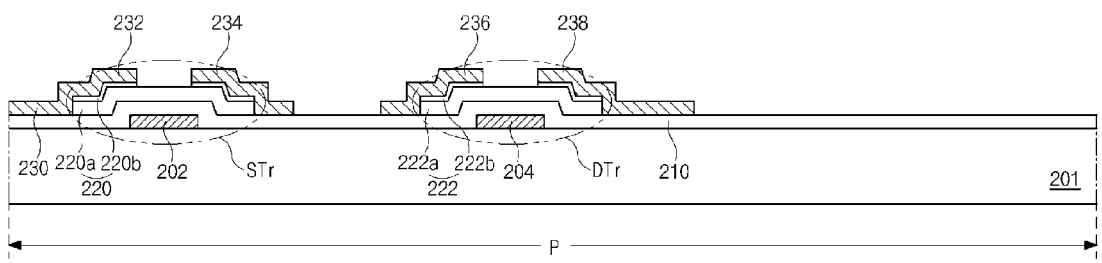

Next, as shown in FIG. 5C according to yet additional embodiments of the present invention, a second metallic material layer (not shown in the figure) is formed by depositing a second metallic material on the first impurity-doped amorphous silicon pattern 224 (of FIG. 5B), the second impurity-doped amorphous silicon pattern 226 (of FIG. 5B), and the gate insulating layer 210. The second metallic material layer may be patterned using various methods, including, but not limited to, a mask process to form the first and second source electrodes 232 and 236, the first and second drain electrodes 234 and 238, and the data line 230. The power line (not shown in the figure) may also be formed to be parallel to the data line 230. Alternatively, the power line may be formed with the gate line (not shown in the figure) to be parallel to the gate line. For example, the second metallic material layer is formed of a relatively low resistance metallic material, for example, Al, Al alloy, Mo, Cu, Cu alloy, or a mixture thereof.

The data line 230 crosses the gate line (not shown in the figure) to define the pixel region "P," and the first source electrode 232 extends from the data line 230. The first source electrode 232 and the first drain electrode 234 are disposed on the first impurity-doped amorphous silicon pattern 224 (of FIG. 5B) and spaced apart from each other. As a result, a center portion of the first impurity-doped amorphous silicon pattern 224 (of FIG. 5B) is exposed through the first source electrode 232 and the first drain electrode 234. In addition, the second source electrode 236 and the second drain electrode 238 are disposed on the second impurity-doped amorphous silicon pattern 226 (of FIG. 5B) and spaced apart from each other. As a result, a center portion of the second impurity-doped amorphous silicon pattern 226 (of FIG. 5B) is exposed through the second source electrode 236 and the second drain electrode 238.

Next, as shown in FIGS. 5B and 5C according to further embodiments of the present invention, the center portion of the first impurity-doped amorphous silicon pattern 224 (of FIG. 5B) is etched using the first source and drain electrodes 232 and 234 as an etching mask to form the first ohmic contact layer 220b and to expose a center portion of the first actively layer 220a. On the other hand, the center portion of the second impurity-doped amorphous silicon pattern 226 (of FIG. 5B) is etched using the second source and drain electrodes 236 and 238 as an etching mask to form the second ohmic contact layer 222b and to expose a center portion of the second actively layer 222a. The first active layer 220a and the first ohmic contact layer 220b constitute the first semiconductor layer 220, and the second active layer 222a and the second ohmic contact layer 222b constitute the second semiconductor layer 222.

According to some embodiments of the present invention, the first gate electrode 202, the gate insulating layer 210, the first semiconductor layer 220, the first source electrode 232 and the first drain electrode 234 constitute a switching TFT "STr," and the second gate electrode 204, the gate insulating layer 210, the second semiconductor layer 222, the second source electrode 236 and the second drain electrode 238 constitute a driving TFT "DTr".

Figure 5D:
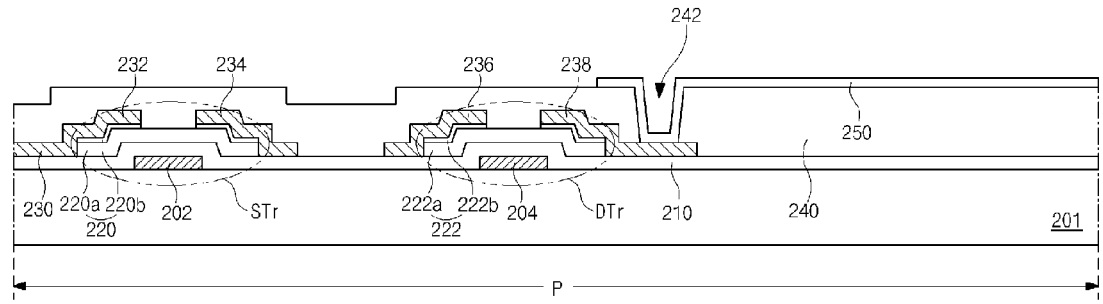

Next, as shown in FIG. 5D according to yet further embodiments of the present invention, the passivation layer 240 is formed on the data line 230, the switching TFT "STr" and the driving TFT "DTr". The passivation layer 240 comprises an inorganic insulating material or an organic insulating material. For example, the inorganic insulating material may include silicon oxide or silicon nitride, and the organic insulating material may include benzocyclobutene (BCB) or photo-acryl. Next, the passivation layer 240 is patterned using various methods, including, but not limited to, a mask process to form the drain contact hole 242 and to expose the second drain electrode 238.

Next, a transparent conductive material layer (not shown in the figure) is formed on the passivation layer 240. The transparent conductive material layer is patterned using various methods, including, but not limited to, a mask process to form the first electrode 250. The first electrode 250 contacts the second drain electrode 238 through the drain contact hole 242. Namely, the first electrode 250 is electrically connected to the driving TFT "DTr." The transparent conductive material may include ITO. Although not shown in the figure, an opaque metallic material layer is formed before forming the transparent conductive material layer. The opaque metallic material layer is also patterned to form the reflective plate.

Figure 5E:
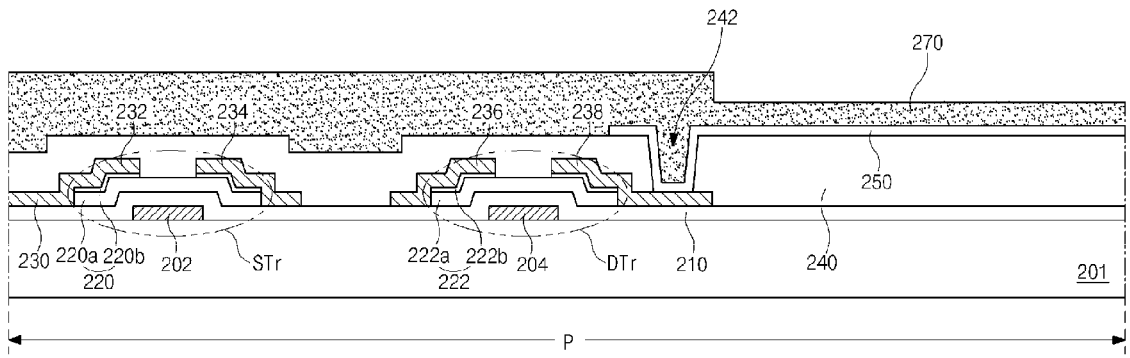

Next, as shown in FIG. 5E, the organic luminescent layer 270 is formed in the pixel region "P."

Figure 5F:
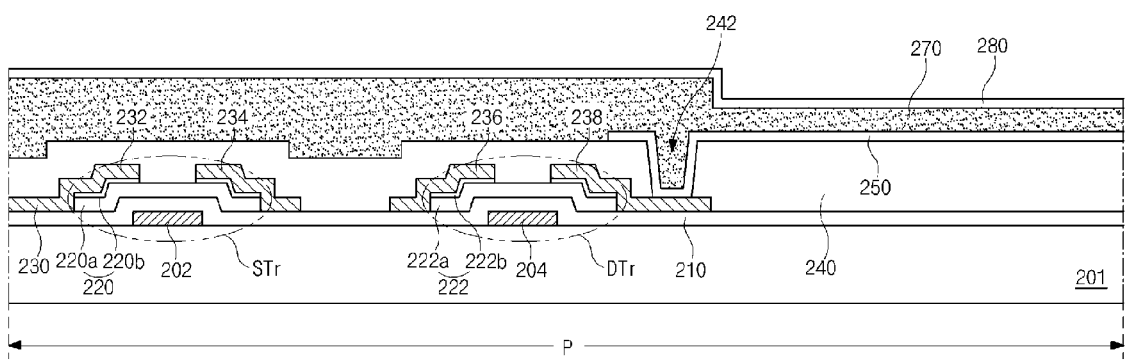

Next, as shown in FIG. 5F, the second electrode 280 is formed on the organic luminescent layer 270. The second electrode 280 may include a single layer of Cu or double layers of Ag and Mg. The second electrode 280 may be made thin to be transparent.

According to some embodiments of the present invention, when the voltage of the power line is applied to the first electrode, the organic luminescent layer 270 emits to display images through the second electrode 280. When the second source and drain electrodes 236 and 238 of the driving TFT "DTr" are electrically shorted by particles or a static electricity, however, the organic luminescent layer 270 always has an emitting state. Accordingly, an additional process is required to overcome the problem.

Figure 5G:
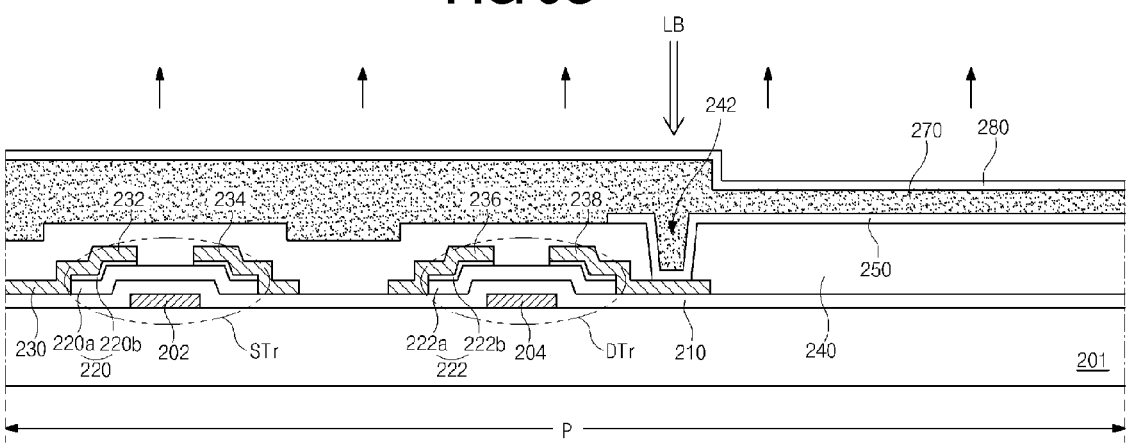

In some exemplary embodiments of the present invention, as shown in FIG. 5G, the laser beam "LB" is irradiated to the drain contact hole 242 through the image display surface, i.e., the second electrode 280. In additional exemplary embodiments, the total thickness of the second electrode 280 and the organic luminescent layer 270 is about 3 to 4 micrometers, and the laser beam "LB" of a pulse type has a wavelength of about 532 nm and an energy of about 0.5 to 0.8 mJ. The laser beam "LB" according to additional embodiments of the present invention includes, but is not limited to, a laser having a wavelength between about 300 nm and about 700 nm, about 400 nm and about 600 nm, about 500 nm and about 550 nm, and about 520 nm and about 540 nm.

Figure 5H:
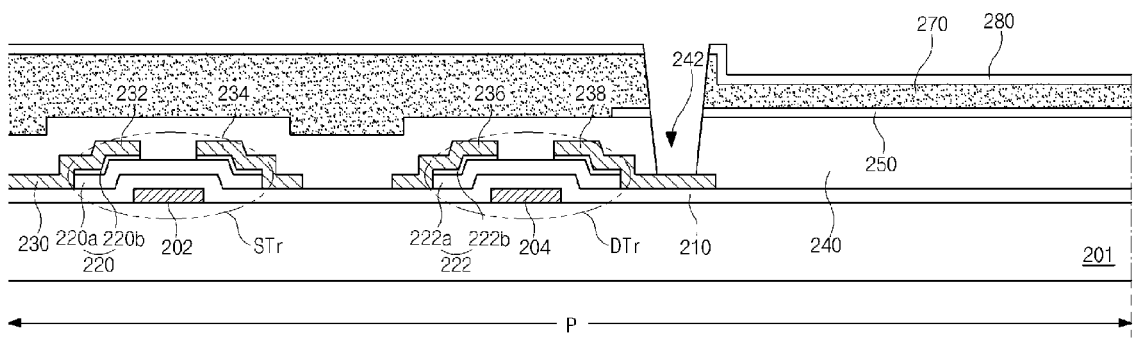

By the laser beam "LB" irradiation, as shown in FIG. 5H, the second electrode 280, the organic luminescent layer 270 and the first electrode 250 are removed such that the second drain electrode 238 is exposed through the drain contact hole 242. Namely, the connection of the organic electroluminescent diode and the driving TFT "DTr" is destroyed. Accordingly, the organic luminescent diode has a non-emission state regardless of a state of the switching TFT "STr" and the driving TFT "DTr" such that the brightening point defect problem is overcome.

As discussed above, the laser beam "LB" of a pulse type may have a wavelength of about 532 nm and an energy of about 0.5 to 0.8 mJ. If the laser beam "LB" is too weak, the connection is incompletely destroyed such that the brightening point defect can not be resolved. On the other hand, if the laser beam is too strong, other elements, for example, the gate line or the data line 230, is cut such that a darkening point defect is also generated in other pixel regions. With the laser beam "LB", the connection of the organic electroluminescent diode and the driving TFT "DTr" is completely destroyed by removing the second electrode 280, the organic luminescent layer 270 and the first electrode 250 without damages on other elements.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an organic electroluminescent device (OELD), wherein the pixel region of the OELD comprises i) a driving thin film transistor (TFT) comprising a drain electrode, ii) a passivation layer covering the driving TFT, while comprising the drain contact hole exposing the drain electrode of the driving TFT, and iii) a first electrode of an organic electroluminescent diode connected to the drain electrode of the driving TFT via the drain contact hole, the method comprising the steps of:
repairing a pixel region by irradiating a laser on the drain contact hole of the passivation layer in a pixel region in need of the repair such that the first electrode of the organic electroluminescent diode is electrically isolated.

2. The method of claim 1, wherein the laser is irradiated through an image display surface of the OELD.

3. The method of claim 1, wherein when the OELD is on, the driving TFT in the pixel region in need of the repair constantly turns on the organic luminescent diode regardless of a voltage supplied to the driving TFT.

4. The method of claim 1, wherein the portion of the driving TFT is exposed after the repairing step.

5. The method of claim 1, wherein the organic electroluminescent diode comprises the first electrode, an organic luminescent layer on the first electrode, and a second electrode on the organic luminescent layer.

6. The method of claim 5, wherein the first electrode, the organic luminescent layer, the second electrode are removed by the repairing step.

7. The method of claim 5, wherein the first electrode is opaque, the second electrode is transparent.

8. The method of claim 7, wherein the laser is irradiated onto the second electrode.

9. The method of claim 1, wherein the laser has a wavelength between about 500 nm and 550 nm, and energy of about 0.3 to about 1.0 mJ.

10. The method of claim 9, wherein the wavelength is about 532 nm, and the energy is about 0.5 to 0.8 mJ.

11. A method of fabricating an array substrate for an organic electroluminescent device (OELD), the method comprising:
forming a driving thin film transistor (TFT) including a drain electrode in each pixel region on a substrate;
forming a passivation layer covering the driving TFT, while comprising a drain contact hole exposing the drain electrode of the driving TFT;
forming an organic electroluminescent diode including a first electrode, the first electrode connected to the drain electrode of the driving TFT via the drain contact hole;
irradiating a laser on the drain contact hole of the passivation layer in a pixel region in need of the repair such that the first electrode is electrically isolated.

12. The method of claim 11, wherein the laser is irradiated through an image display surface of the OELD.

13. The method of claim 11, wherein when the OELD is on, the driving TFT in the pixel region constantly turns on the organic luminescent diode regardless of a voltage supplied to the driving TFT.

14. The method of claim 11, wherein the portion of the driving TFT is exposed after the irradiating step.

15. The method of claim 11, wherein the step of forming the organic electroluminescent diode comprises the steps of:
- forming the first electrode on the passivation layer;
- forming an organic luminescent layer on the first electrode; and
- forming a second electrode on the organic luminescent layer.

16. The method of claim 15, wherein the first electrode is opaque, the second electrode is transparent, and the laser is irradiated onto the second electrode.

17. The method of claim 15, wherein the first electrode, the organic luminescent layer, the second electrode are removed by the irradiating step.

18. The method of claim 11, wherein the laser has a wavelength between about 500 nm and 550 nm, and energy of about 0.3 to about 1.0 mJ.

19. The method of claim 18, wherein the wavelength is about 532 nm, and the energy is about 0.5 to 0.8 mJ.

* * * * *